United States Patent
Hussain

(10) Patent No.: US 11,243,185 B2
(45) Date of Patent: Feb. 8, 2022

(54) SILICON NANOTUBE SENSOR AND METHOD OF MANUFACTURE

(71) Applicant: KING ABDULLAH UNIVERSITY OF SCIENCE AND TECHNOLOGY, Thuwal (SA)

(72) Inventor: Muhammad Mustafa Hussain, Hercules, CA (US)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 0 days.

(21) Appl. No.: 16/771,040

(22) PCT Filed: Dec. 13, 2018

(86) PCT No.: PCT/IB2018/060035
§ 371 (c)(1),
(2) Date: Jun. 9, 2020

(87) PCT Pub. No.: WO2019/123142
PCT Pub. Date: Jun. 27, 2019

(65) Prior Publication Data
US 2021/0172906 A1    Jun. 10, 2021

Related U.S. Application Data

(60) Provisional application No. 62/608,216, filed on Dec. 20, 2017.

(51) Int. Cl.
*G01N 27/414* (2006.01)
*H01L 29/06* (2006.01)

(52) U.S. Cl.
CPC ..... *G01N 27/4146* (2013.01); *G01N 27/4145* (2013.01); *H01L 29/0676* (2013.01)

(58) Field of Classification Search
CPC ............ H01L 29/0665; H01L 29/0676; H01L 29/41758; H01L 29/66666; H01L 29/7827;
(Continued)

(56) References Cited

U.S. PATENT DOCUMENTS

2009/0085071 A1* 4/2009 Brongersma ...... G01N 27/4146
257/253
2010/0176822 A1   7/2010 Offermans et al.
(Continued)

OTHER PUBLICATIONS

Fahad, H.M., "3D Nanotube Field Effect Transistors for Hybrid High-Performance and Low-Power Operation with High Chip-Area Efficiency," Dissertation, King Abdullah University of Science and Technology, Feb. 2014, 129 pages.
(Continued)

*Primary Examiner* — David C Spalla
(74) *Attorney, Agent, or Firm* — Patent Portfolio Builders PLLC

(57) ABSTRACT

A sensor includes a substrate and a nanotube structure formed on top of the substrate. A body is formed on top of the substrate and surrounds the nanotube structure. A source contact is electrically coupled to a top portion of the nanotube structure. A drain contact is arranged on top of the substrate and is electrically coupled with a bottom portion of the nanotube structure. A gate contact is arranged on top of the nanotube structure. The gate contact is electrically is isolated from the top portion of the nanotube structure and electrically coupled with a middle portion of the nanotube structure. The top portion of the nanotube structure is exposed to an environment surrounding the sensor.

18 Claims, 15 Drawing Sheets

(58) Field of Classification Search
CPC .......... H01L 29/78642; G01N 27/4145; G01N 27/4146
See application file for complete search history.

(56) References Cited

U.S. PATENT DOCUMENTS

2011/0147802 A1    6/2011  Colli
2014/0008606 A1*   1/2014  Hussain ............ H01L 29/66484
                                                            257/9

OTHER PUBLICATIONS

Fahad, H.M., et al., "Silicon Nanotube Field Effect Transistor with Core-Shell Gate Stacks for Enhanced High-Performance Operation and Area Scaling Benefits," Nano Letters, Oct. 12, 2011, vol. 11, No. 10, pp. 4393-4399.

Grieshaber, D. et al., "Electrochemical Biosensors—Sensor Principles and Architectures," Sensors, Mar. 7, 2008, vol. 8, pp. 1400-1458.

International Search Report in corresponding/related International Application No. PCT/IB2018/060035, dated Apr. 8, 2019.

Roy, M., et al., "A Novel Approach for Modeling the Threshold Voltage of Cylindrical Ion Sensitive Field Effect Transistor," 2009 International Conference on Emerging Trends in Electronic and Photonic Devices & Systems (ELECTRO-2009), Piscataway, NJ, USA, Dec. 22, 2009, pp. 53-57.

Written Opinion of the International Searching Authority in corresponding/related International Application No. PCT/IB2018/060035, dated Apr. 8, 2019.

* cited by examiner

SILICON NANOTUBE SENSOR AND METHOD OF MANUFACTURE

CROSS-REFERENCE TO RELATED APPLICATIONS

This application is a U.S. National Stage of Application of International Application No. PCT/IB2018/060035, filed on Dec. 13, 2018, which claims priority to U.S. Provisional Patent Application No. 62/608,216, filed on Dec. 20, 2017, entitled "SILICON NANOTUBE FETS FOR ENERGY EFFICIENT ELECTRONIC SYSTEMS," the disclosure of which are incorporated herein by reference in their entirety.

BACKGROUND

Technical Field

Embodiments of the subject matter disclosed herein generally relate to a silicon nanotube sensor, and more specifically to a nanotube field effect transmitter-based sensor.

Discussion of the Background

There is currently explosive growth of Internet of Things (IoT) devices, where trillions of small stand-alone sensors and devices will be interconnected and integrated, the number of devices connected to the internet is expected to grow to 20 billion by 2020. Adoption of small stand-alone sensors requires that the sensors be as efficient as possible with respect to the space occupied by the sensor.

Conventional small stand-alone sensors in the nano-scale typically require an array of laterally stacked gate all-around nanowires that occupy considerable space. Further, conventional small stand-alone sensors typically provide very limited surface area for interacting with target molecules, which results in long responses times for sensing, and in some cases not sensing target molecules that are present in the environment.

Therefore, it would be desirable to provide sensors that are space-efficient and provide quick sensing response times.

SUMMARY

According to an embodiment, there is a sensor, which includes a substrate and a nanotube structure formed on top of the substrate. A body is formed on top of the substrate and surrounds the nanotube structure. A source contact is electrically coupled to a top portion of the nanotube structure. A drain contact is arranged on top of the substrate and is electrically coupled with a bottom portion of the nanotube structure. A gate contact is arranged on top of the nanotube structure. The gate contact is electrically is isolated from the top portion of the nanotube structure and electrically coupled with a middle portion of the nanotube structure. The top portion of the nanotube structure is exposed to an environment surrounding the sensor.

According to another embodiment, there is a method for forming a sensor. A nanotube structure is formed on top of a substrate. A drain contact is formed on top of the substrate and is electrically coupled with a bottom portion of the nanotube structure. A body is formed on top of the substrate and surrounding the nanotube structure. A gate contact is formed on top of the nanotube structure so that the gate contact is electrically isolated from a top portion of the nanotube structure and is electrically coupled with a middle portion of the nanotube structure. A source contact is formed so that it is electrically coupled to the top portion of the nanotube structure. The top portion of the nanotube structure is exposed to an environment surrounding the sensor.

According to a further embodiment, there is a sensor system that includes a processor and a sensor coupled to the processor. The sensor includes a substrate and a nanotube structure formed on top of the substrate. A body is formed on top of the substrate and surrounds the nanotube structure. A source contact is electrically coupled to a top portion of the nanotube structure. A drain contact is arranged on top of the substrate and is electrically coupled with a bottom portion of the nanotube structure. A gate contact is arranged on top of the nanotube structure. The gate contact is electrically is isolated from the top portion of the nanotube structure and electrically coupled with a middle portion of the nanotube structure. The top portion of the nanotube structure is exposed to an environment surrounding the sensor.

BRIEF DESCRIPTON OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a field effect transistor-based nanotube sensor. However, the embodiments discussed herein are not limited to this transistor but may be applied to other transistors.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
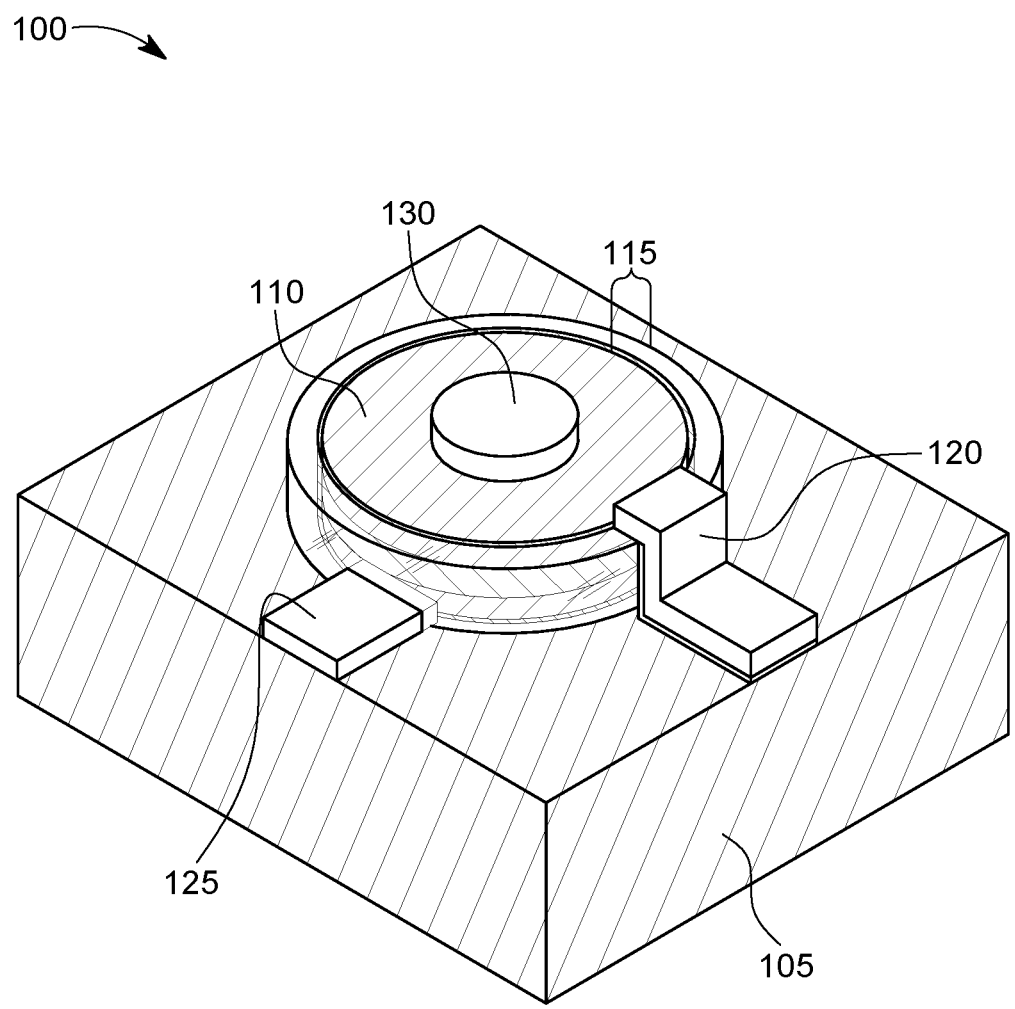
FIG. 1 illustrates a three-dimensional perspective view of a nanotube field effect transmitter-based sensor according to embodiments.

FIG. 1 illustrates a three-dimensional view of a nanotube field effect transmitter-based sensor according to embodiments. The sensor 100 includes a substrate 105 and a nanotube structure 110 formed on top of the substrate 105. A body 115 is formed on top of the substrate 105 so that it surrounds the nanotube structure 110. A source contact 120 is electrically coupled to a top of the nanotube structure 110. A drain contact 125 is arranged on top of the substrate 105 and is electrically coupled with a bottom portion of the nanotube structure 110. A gate contact 130 is arranged on top of the nanotube structure 110. The gate contact 130 is electrically is isolated from the top of the nanotube structure 110 and electrically coupled with a middle portion of the nanotube structure 110. The top of the nanotube structure 110 is exposed to an environment surrounding the sensor 100. In an embodiment, the drain contact 125 can be omitted and a heavily doped silicon substrate 105 can act as a back-side drain contact.

As illustrated in FIG. 1, the top of the nanotube structure 110 is covered only by the gate contact 130 and a portion of the source contact 120. In one example, at least 85% of the surface area of the top of the nanotube structure 110 is exposed to the environment surrounding the sensor, i.e., at least 85% is not obscured by any other component of the sensor. In other embodiments, at least 90% of the surface area of the top of the nanotube structure 110 is exposed to the environment surrounding the sensor. Thus, as will be appreciated, the sensor 100 is particularly advantageous because of the large amount of surface area exposed to the environment, which leads to a shorter sensing time compared to conventional sensors due to the larger amount of surface area that can interact with target molecules in the environment surrounding the sensor 100. This provides a high signal-to-noise ratio.

Figure 2A:
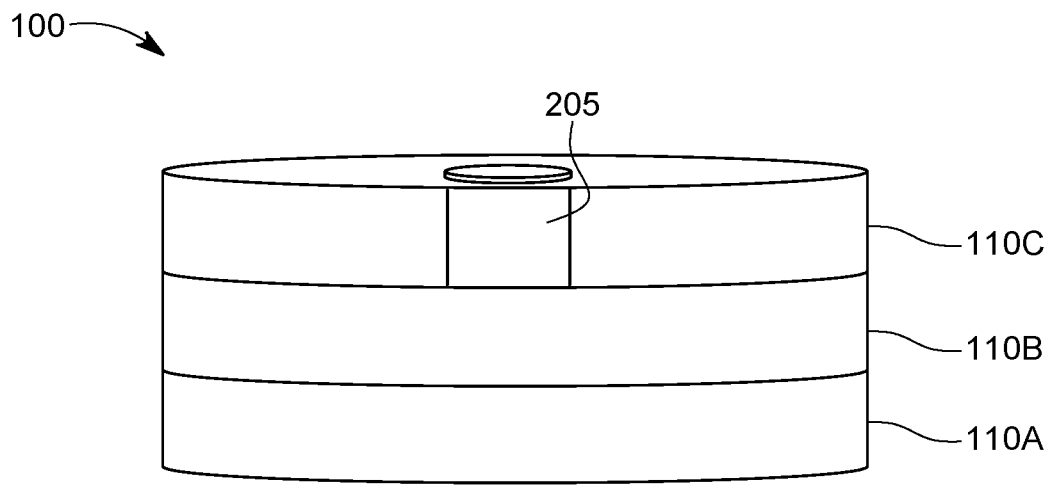
FIG. 2A illustrates a side view of a nanotube field effect transmitter-based sensor according to embodiments.

FIG. 2A is a perspective view of the nanotube structure 110 according to embodiments. The sensor 100 is configured as a nanotube field-effect transistor (NT-FT). Accordingly, the drain region is formed by the bottom portion 110A of the nanotube structure 110, the channel region is formed by the middle portion 110B of the nanotube structure 110, and the source region is formed by the top portion 110C of the nanotube structure 110. A passage 205 is formed from the top of the nanotube structure 110 to the middle portion 110B so that the gate contact 130 is electrically coupled to the channel. In an embodiment, the top 110C and bottom 110A portions of the nanotube structure 110 are p-type doped and the middle portion 110B is n-type doped. One skilled in the art will recognize how to select particular doping concentrations to optimize performance. In an embodiment, the first 110A and third 110C portions comprise silicon oxide ($SiO_2$) and the middle portion 110B comprises titanium nitride (TiN).

Figure 2B:
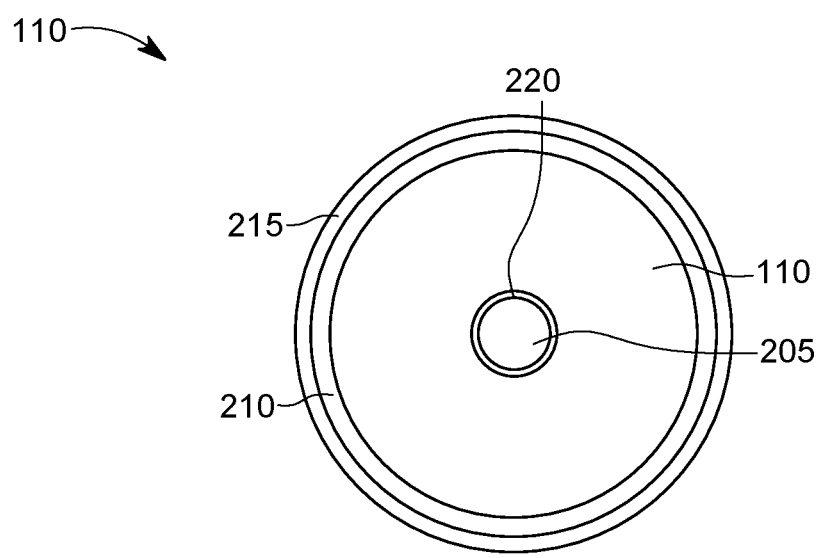
FIG. 2B illustrates a top view of a nanotube field effect transmitter-based sensor according to embodiments.

FIG. 2B is a top view of the sensor 100. As illustrated, the passage 205 is arranged in the middle of the nanotube structure 110. The body 115 comprises a gate dielectric 210 surrounding the nanotube structure 210 and a spacer 215 surrounding the gate dielectric. In an embodiment, the spacer can comprise, for example, polysilicon. Further, an insulator 220 is arranged in the passage 205. In an embodiment, the inner diameter of the passage 205 can be, for example, sub-300 nm and the periphery of the sensor 100 can be approximately 1 µm.

In an embodiment the gate dielectric can be aluminum oxide ($Al_2O_3$), which can be used for sensing hydrogen, oxygen, and/or nitrogen oxide. The particular material of the gate dielectric can be different depending upon the particular molecules that are being sensed. For example, if the sensor 100 is a pH sensor, then the gate dielectric 210 can comprise hafnium oxide ($HfO_2$). In other embodiments, the gate dielectric 210 can include an enzyme selected for the particular type of sensing. For example, if the sensor is designed to detect penicillin, then the gate dielectric can be, for example, an aluminum oxide ($Al_2O_3$) that includes the enzyme penicillinase.

As will be appreciated from FIGS. 1, 2A and 2B, the cylindrical shape of the sensor 100 is particularly advantageous because it consumes less area than polyhedral-shaped sensors, such as lateral nanowire and two-dimensional atomic crystal sensors. Specifically, a nanotube device takes up $d^2$ (d=diameter). However, if the nanotube is cut along its length to use it as a 2D sheet of atomic thin film channel then it will use l×d×3.14. Because one expects to use high aspect ratio nanowire or nanotube, the two-dimensional version of the same geography will require more area for its positioning. From a chip-area perspective, consider an array of vertically stacked gate all-around nanowire field effect transistor (GAA NWFET) having a minimum contact-gate pitch ζ of 5 nm, minimum device-device pitch λ between 70 and 80 nm, and minimum contact width W of 20 nm for a pMOS device at the 15 nm technology node. Theoretically, 13 nanowires need to be stacked in the gate-all-around fashion to achieve a drive current of a single silicon nanotube FET having an inner core gate diameter of 100 nm. In order to compare one silicon nanotube FET with 13×GAA NWFETs, consider that both devices have a back-gated source contact. For relaxed processing constraints, a contact width W of 300 nm is considered. The total contact area per unit length consumed by 13 nanowires based on the 15 nm technology node parameters is:

$$A_{NW\_norm} = 13 \times (\lambda + \zeta + 2 \times W) \sim 8.775 \text{ µm} \quad (1)$$

The equivalent normalized contact area consumed by a silicon nanotube transistor can be calculated as:

$$A_{NT\_norm} = 1 \times (\lambda + \zeta + 3 \times W) \sim 0.975 \text{ µm} \quad (2)$$

Taking the ratio of the two normalized contact areas gives a value of approximately 11% (0.975 µm/8.775 µm). Thus, a single 20 nm gate length, 10 nm thick p-FET silicon nanotube transistor is capable of providing the output drive current of approximately 13 nanowires (20 nm diameter) in a gate-all-around configuration while maintaining an off-state leakage current similar to that of a single 20 nm diameter nanowire FET. At the same time the nanotube FET occupies a contact area equivalent to just around 11% of that occupied by the 13 GAA NWFETs.

To compare the nanotube FET with a lateral array of GAA NWFETs, one needs to consider the effective area footprint occupied by the 13 nanowires and a single nanotube. In the case of laterally stacked GAA NWFETs, if one assumes a nanowire pitch λ of 4 nm and nanowire physical length $L_{phys}$ of 800 nm and diameters DNW of 20 nm, the total area occupied by 13 nanowires in the lateral array is approximately:

$$A_{NW} = L_{phys} \times [(13-1) \times \lambda + 13 \times D_{NW}] = 0.25 \text{ µm}^2 \quad (3)$$

For the case of a single nanotube:

$$A_{NT\_norm} = \pi \times r^{2/2} = 0.038 \text{ µm}^2 \quad (4)$$

The total non-normalized area occupied by the nanotube is about 0.038 µm² with the dimensions above. A ratio of the areas indicates that a single nanotube occupies an area of 15% compared to 13 (800 nm long) laterally stacked GAA nanowires.

Figure 2C:
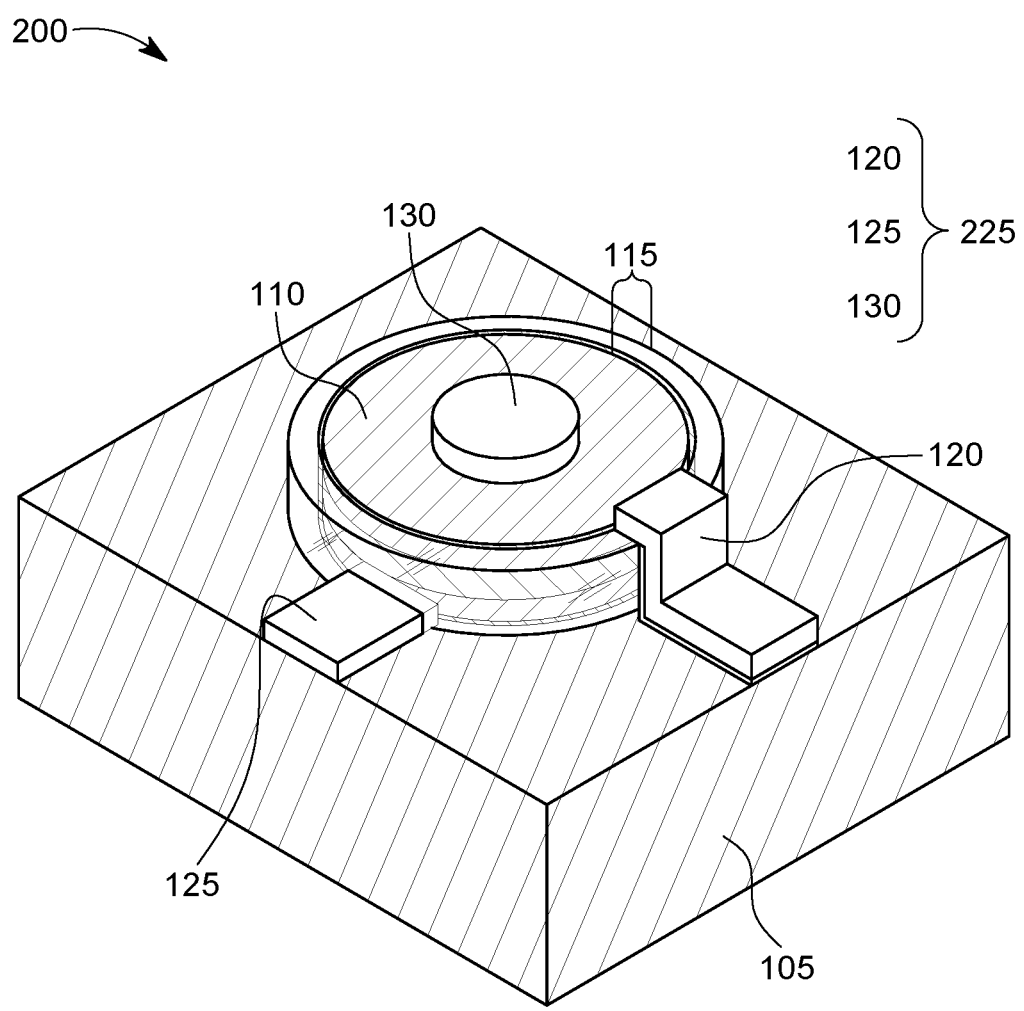
FIG. 2C illustrates a nanotube field effect transmitter-based sensor system according to embodiments.

FIG. 2C illustrates a sensor system according to embodiments. As illustrated, the sensor system 200 includes a processor 225 coupled to the sensor 100 illustrated and described above in connection with FIGS. 1, 2A, and 2B. Specifically, the processor is electrically coupled to the source contact 120, the drain contact 125, and the gate contact 130. The processor 225 can obtain measurements made by sensor 100. The processor 225 can be coupled to a display for outputting the measurements made by sensor 100. Alternatively, or additionally, the processor can include an integrated wired or wireless communication interface (or can be coupled to an external wired or wireless communication interface) to send the measurements made by sensor 100 to another device. The processor 225 can be any type of processor, such as, for example, a microprocessor, an application specific integrated circuit (ASIC), field programmable gate array (FPGA), or the like.

Figure 3:
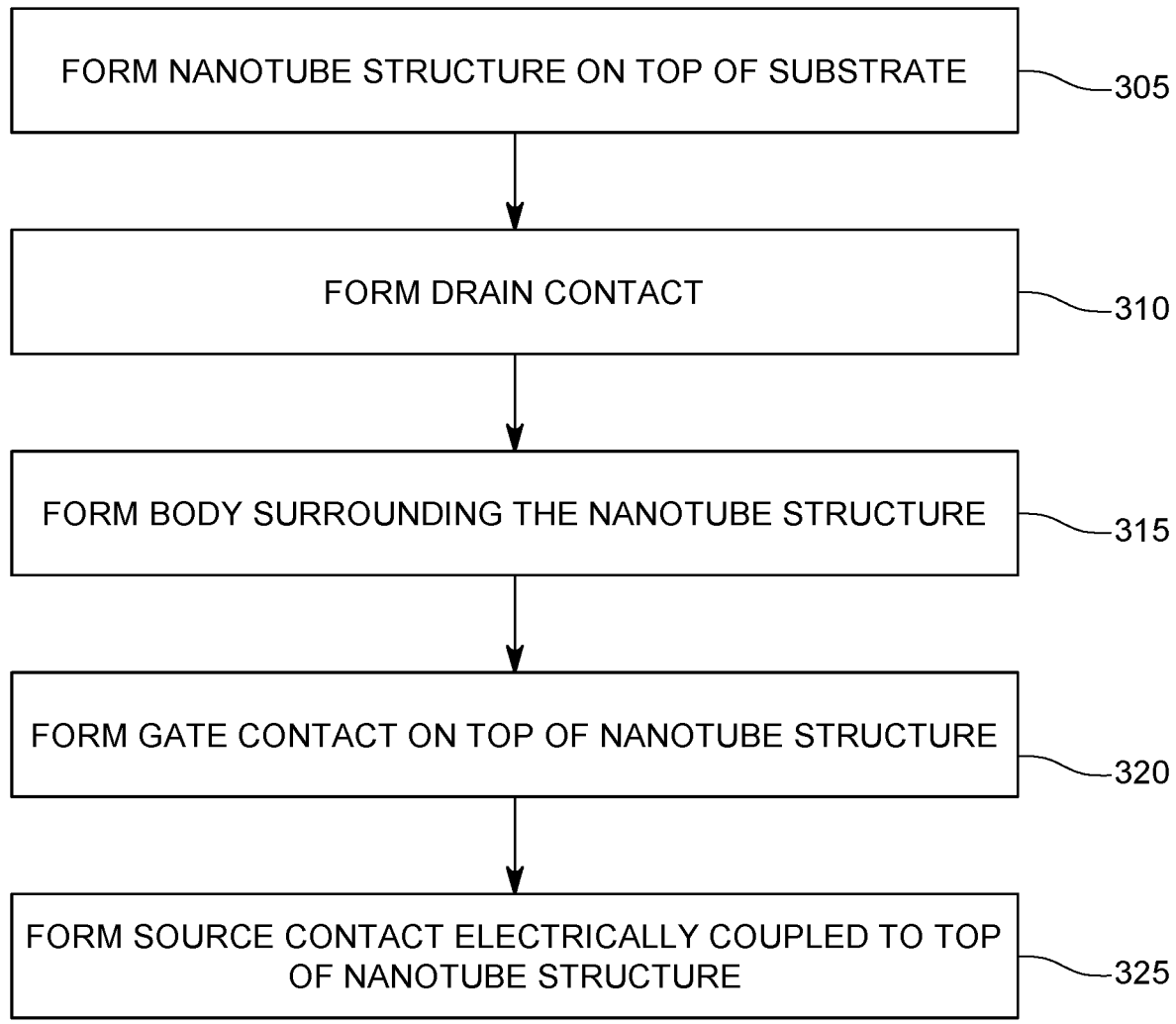
FIG. 3 illustrates a flowchart of a method for making a nanotube field effect transmitter-based sensor according to embodiments.
Figure 4A:
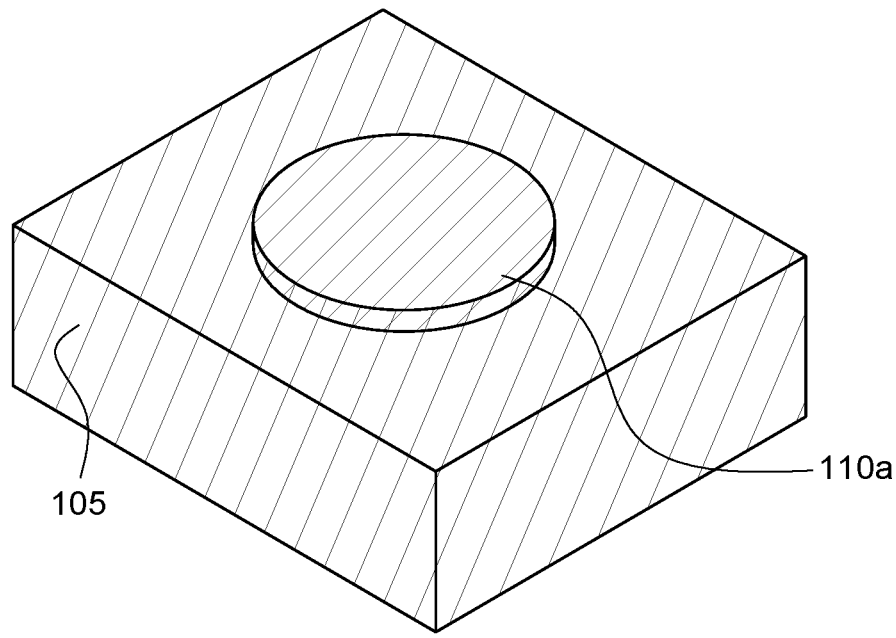
FIGS. 4A-4K illustrate three-dimensional perspective views of the manufacture of a nanotube field effect transmitter-based sensor according to embodiments.
Figure 4B:
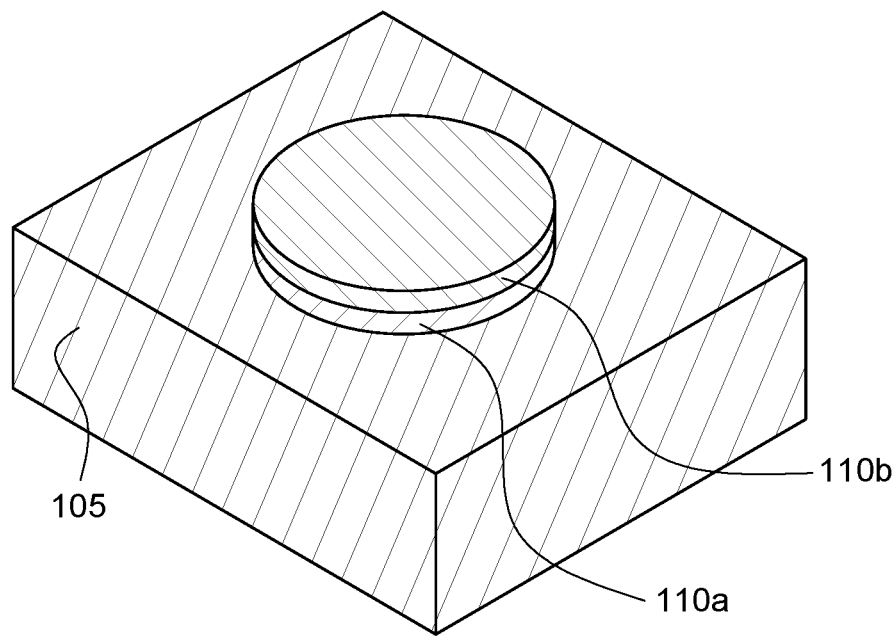
Figure 4C:
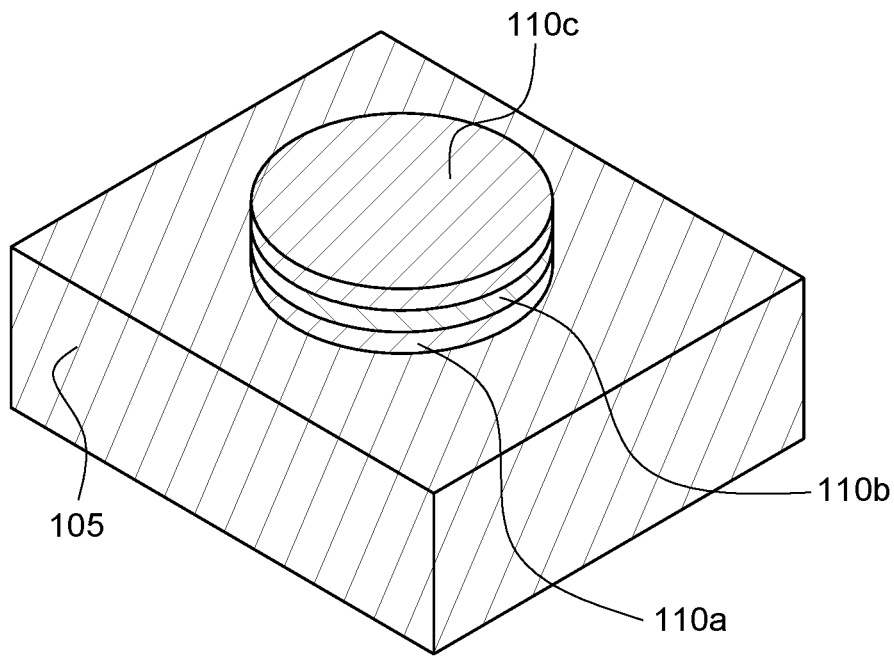

A method for forming the sensor 100 will now be described in connection with the flowchart of FIG. 3 and the diagrams in FIGS. 4A-4K. Initially, a nanotube structure 110 is formed on top of a substrate 105 (step 305). Specifically, as illustrated in FIGS. 4A-4C, a first doped layer 110A is formed on the substrate as the bottom portion of the nanotube structure 110, a second doped layer 110B is formed on top of the first doped layer 110A and serves as the middle portion of the nanotube structure 110, and a third doped layer 110C is formed on top of the second doped layer 110B and serves as a top portion of the nanotube structure 110.

Figure 4D:
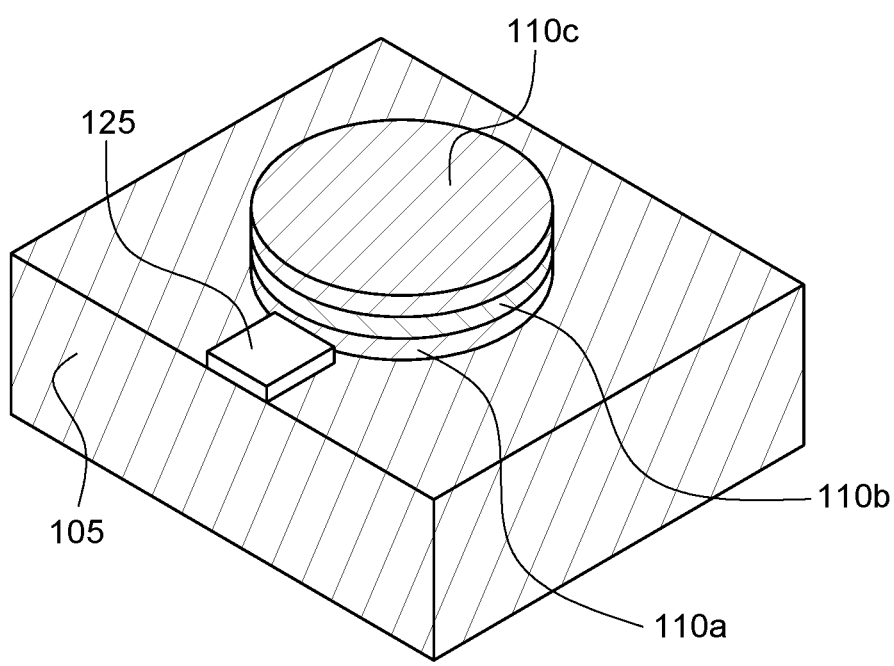
Figure 4E:
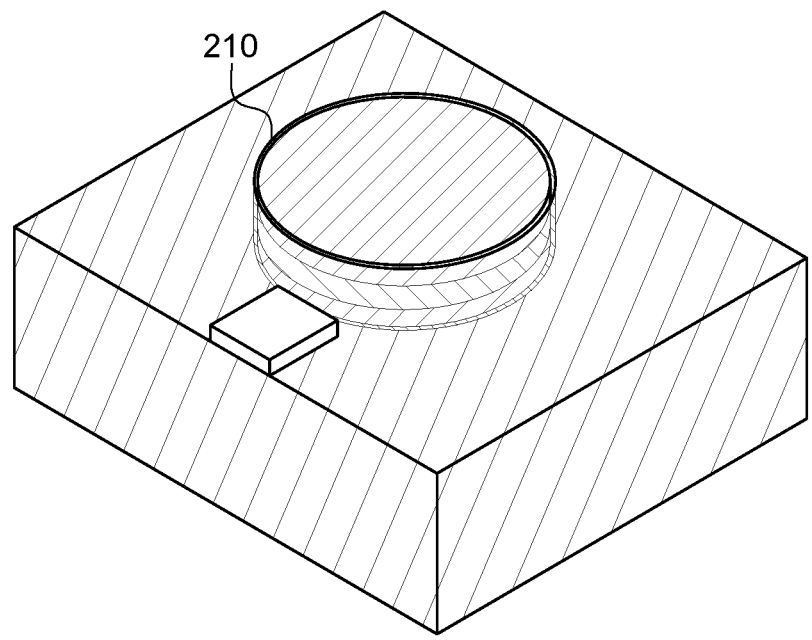
Figure 4F:
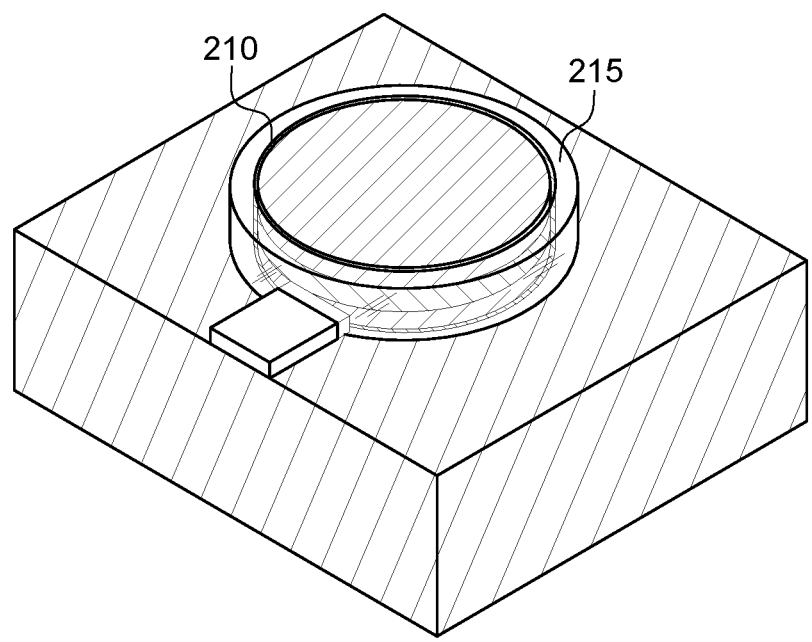
Figure 4G:
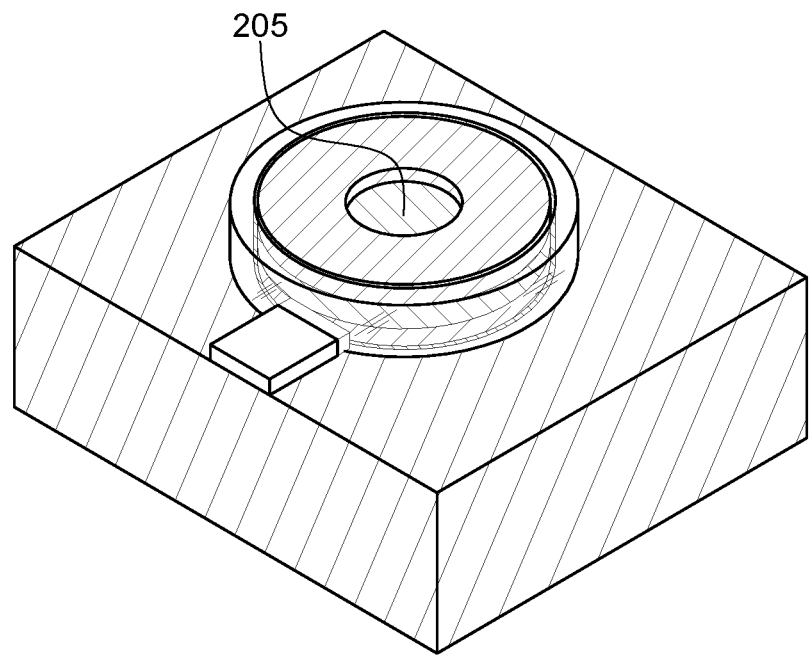

As illustrated in FIG. 4D, a drain contact 125 is then formed on top of the substrate 105 and is electrically coupled with a bottom portion of the nanotube structure 110 (step 310). More specifically, the drain contact is electrically coupled with the first doped layer 110A. A body 115 is formed on top of the substrate 105 so that it surrounds the nanotube structure 110 (step 315). Specifically, as illustrated in FIGS. 4E and 4F, first a gate dielectric 210 is formed around the periphery of the nanotube structure 110, and then a spacer 215 is arranged around the periphery of the gate dielectric 210. In an embodiment, the gate dielectric 210 can be, for example, aluminum oxide ($Al_2O_3$), hafnium oxide ($HfO_2$), etc., and the spacer 215 can be, for example, polysilicon.

Figure 4H:
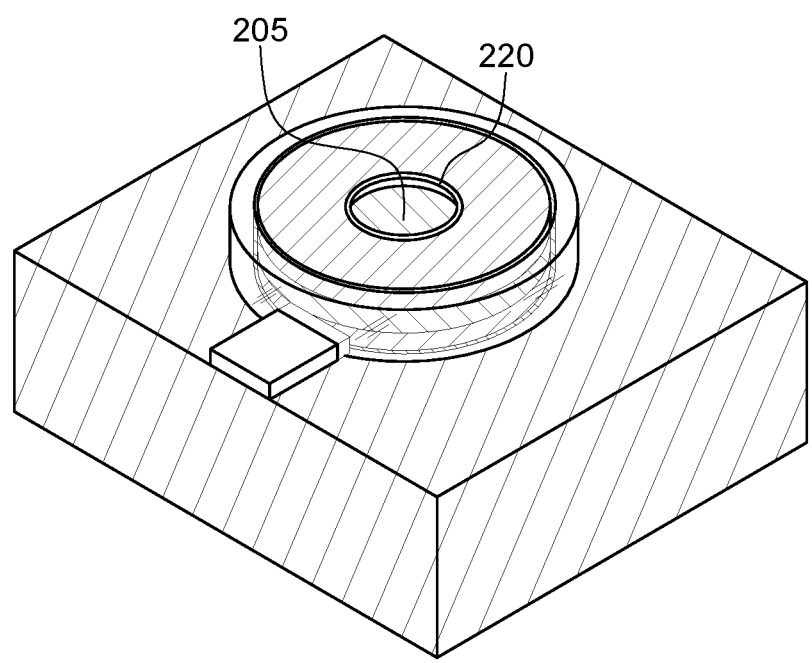
Figure 4I:
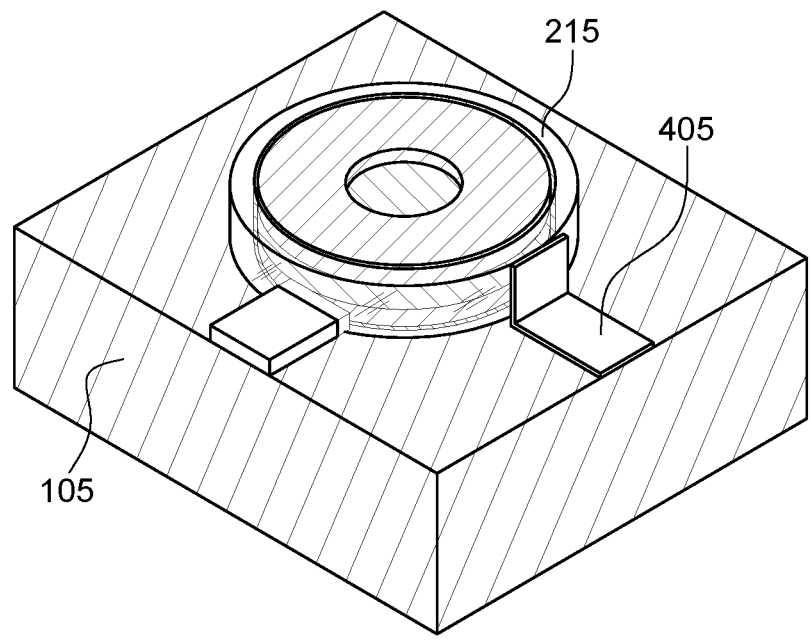

A gate contact 130 is then formed on top of the nanotube structure 110 so that the gate contact 130 is electrically isolated from the top of the nanotube structure 110 and is electrically coupled with a middle portion 110B of the nanotube structure 110 (step 320). Specifically, referring to FIGS. 4G-4J, a passage 205 is formed in the top portion 110C of the nanotube structure 110 to expose the middle portion 110B of the nanotube structure 110. Then an insulator 220 is formed on the inner periphery of the passage 205, as illustrated in FIG. 4H.

Figure 4J:
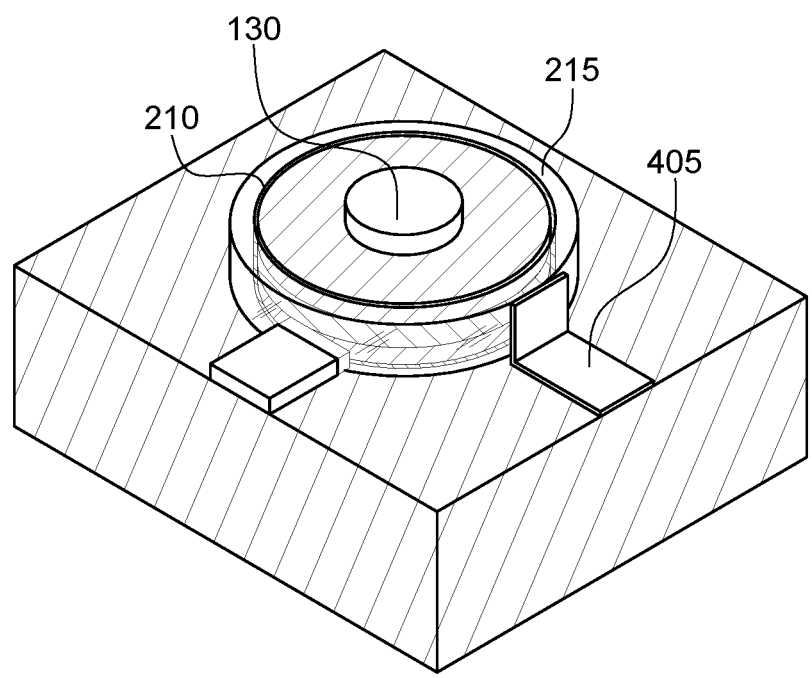
Figure 4K:
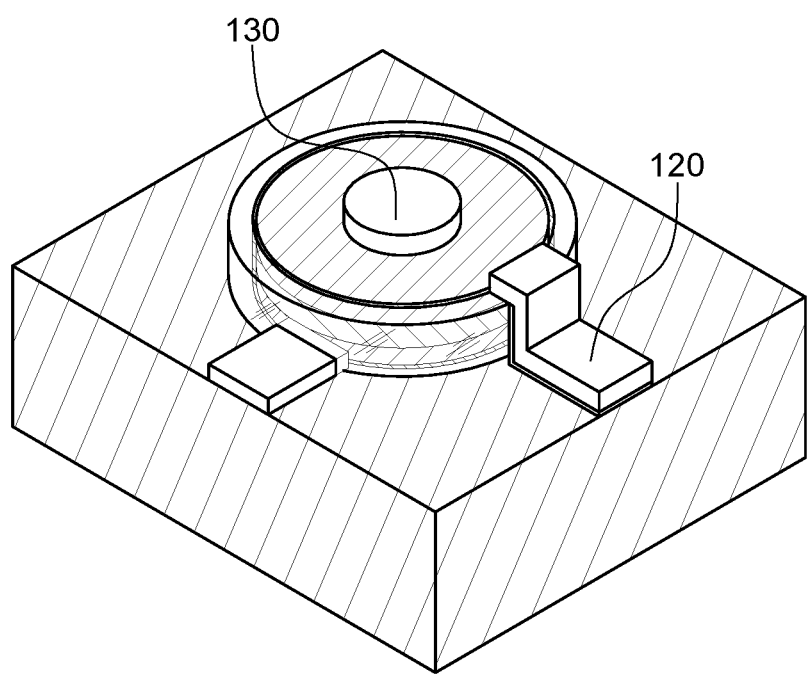
Figure 5:
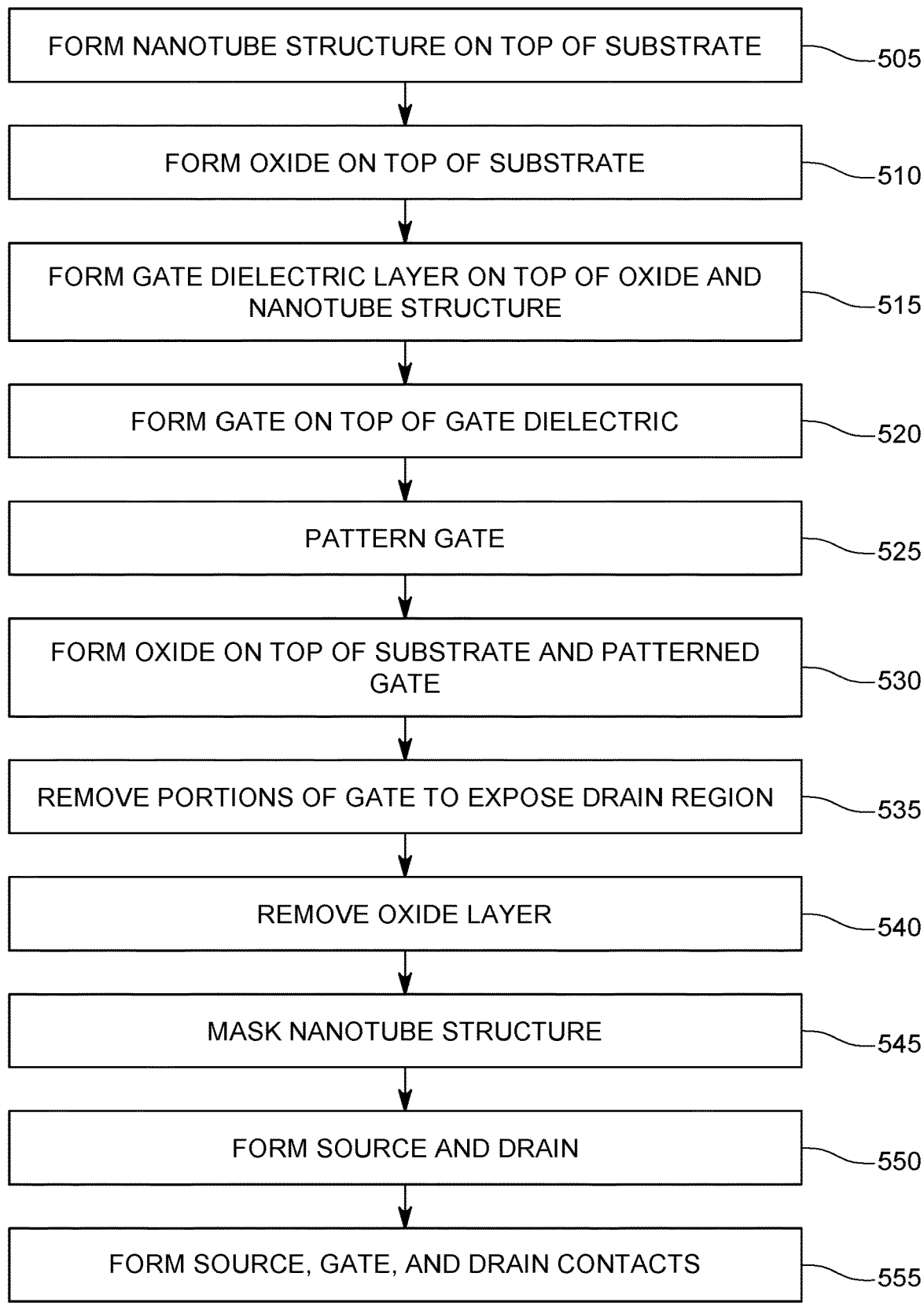
FIG. 5 illustrates a flowchart of a method for making a nanotube field effect transmitter-based sensor according to embodiments.

In order to form the source contact in the following step, an L-shaped spacer 405 is formed so that a portion is on top of the substrate and another portion runs vertically along an outer periphery of the spacer 215. The gate contact 130 is then formed on top of the nanotube structure 110, which is illustrated in FIG. 4J. The gate contact 130 passes through the passage 205 so that it is in contact with the middle portion 110B of the nanotube structure 110. Finally, a source contact 120 is formed so that it is electrically coupled to a top of the nanotube structure 110 (step 325). As illustrated in FIG. 4K, the source contact 120 is formed so that it is on top of the L-shaped spacer 405, a top portion of spacer 215 and gate dielectric 210, and the top of the nanotube structure 110.

Although the method of FIGS. 3A and 4A-4K has been described as forming the doped layers 110A-110C at the beginning of the process, these layers can be initially formed undoped and the doping can be performed after the body 120 is formed, for example, using vertical and angled ion implantation to form the source and drain.

As will be appreciated from the method described above, the formation of the sensor 100 is particularly advantageous because it does not require any type of transfer process, which allows the formation of a compact sensor with more precise positioning of components of the sensor.

Figure 6A:
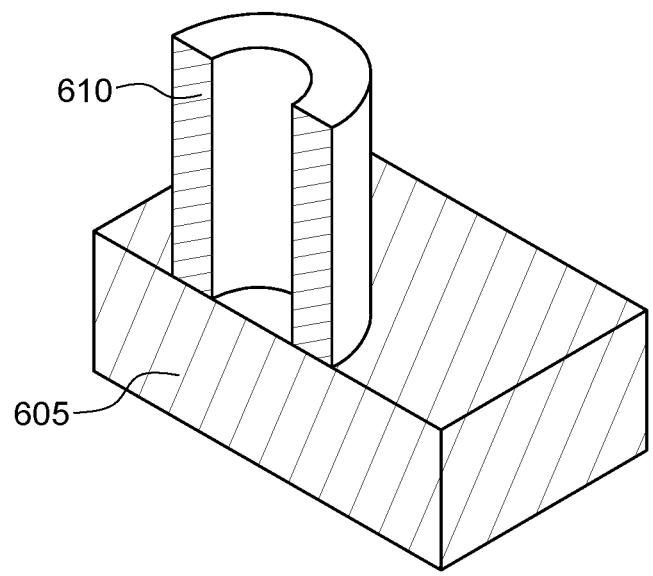
FIGS. 6A-6H illustrate three-dimensional perspective views of the manufacture of a nanotube field effect transmitter-based sensor according to embodiments.
Figure 6B:
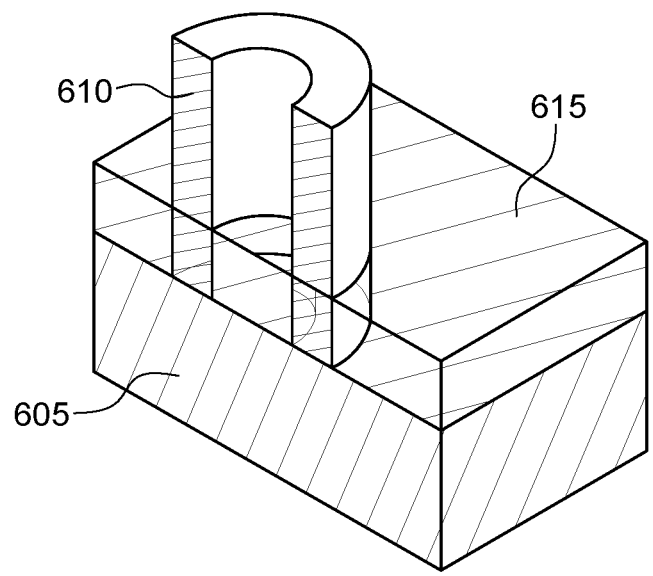
Figure 6C:
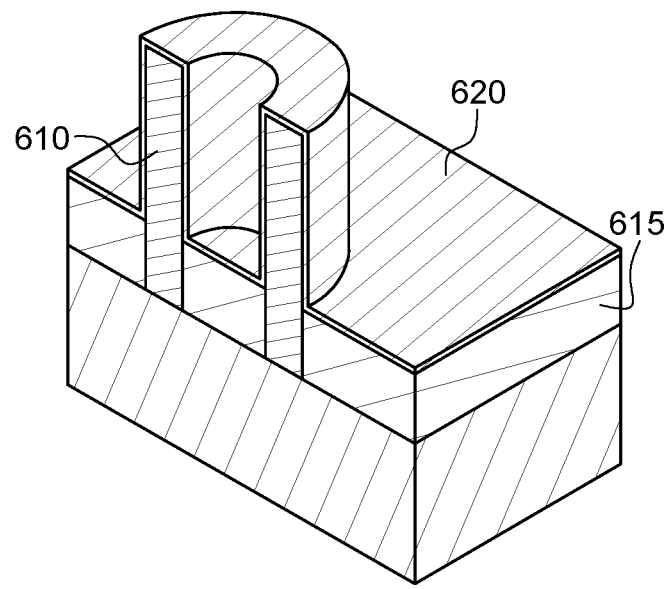
Figure 6D:
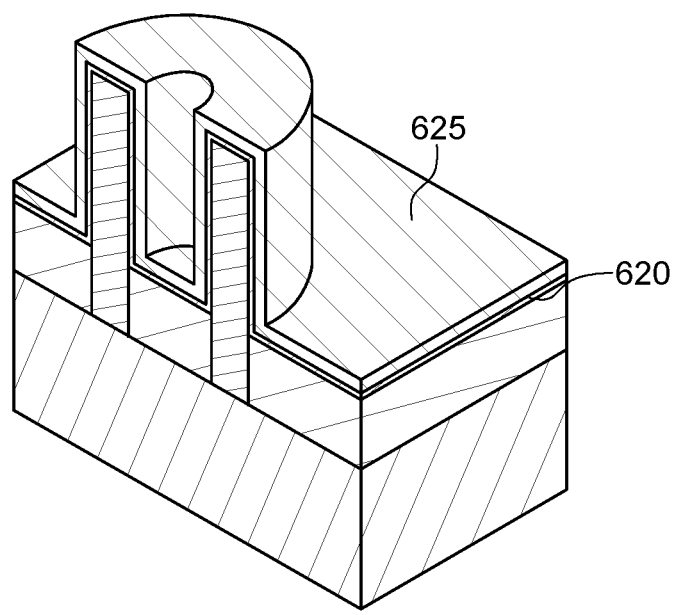

The method described above in connection with FIGS. 3 and 4A-4K is a bottom-up method of forming a sensor. The sensor can also be formed using a top-down method, which will now be described in connection with FIGS. 5 and 6A-6H. Initially, as illustrated in FIG. 6A, a nanotube structure 610 is formed on a substrate 605 (step 505). An oxide layer 615 is then formed on top of the substrate 605 (step 510), which is illustrated in FIG. 6B. As illustrated in FIG. 6C, a gate dielectric layer 620 is formed on the oxide layer 615 and on a top portion and outer periphery of the nanotube structure 610 (step 515). A gate 625 is formed on top of the gate dielectric layer 620 (step 520), which is illustrated in FIG. 6D.

Figure 6E:
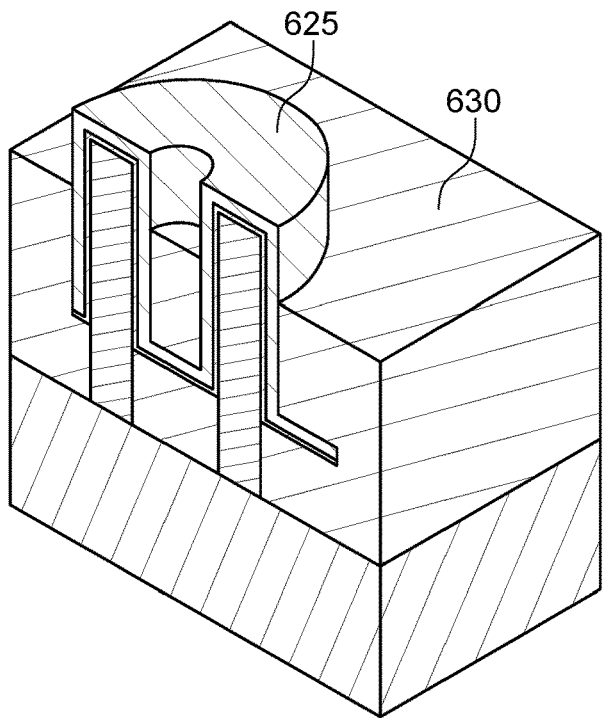
Figure 6F:
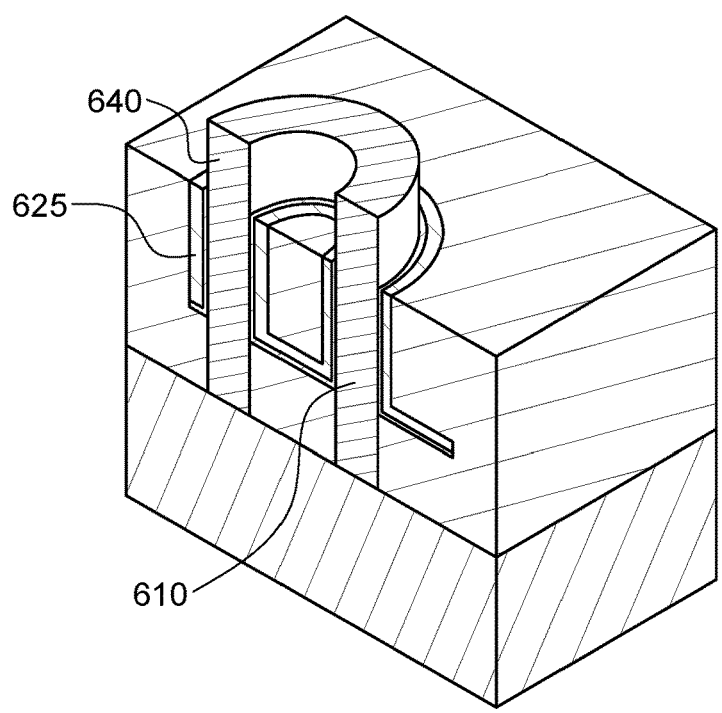

The gate 625 is then patterned (step 525) and an oxide layer 630 is then formed on top of the patterned gate 625 and the oxide layer 615 (step 530). The resulting structure is illustrated in FIG. 6E. As illustrated in FIG. 6F, portions of the gate 625 are removed to expose the drain region 640 (step 535).

Figure 6G:
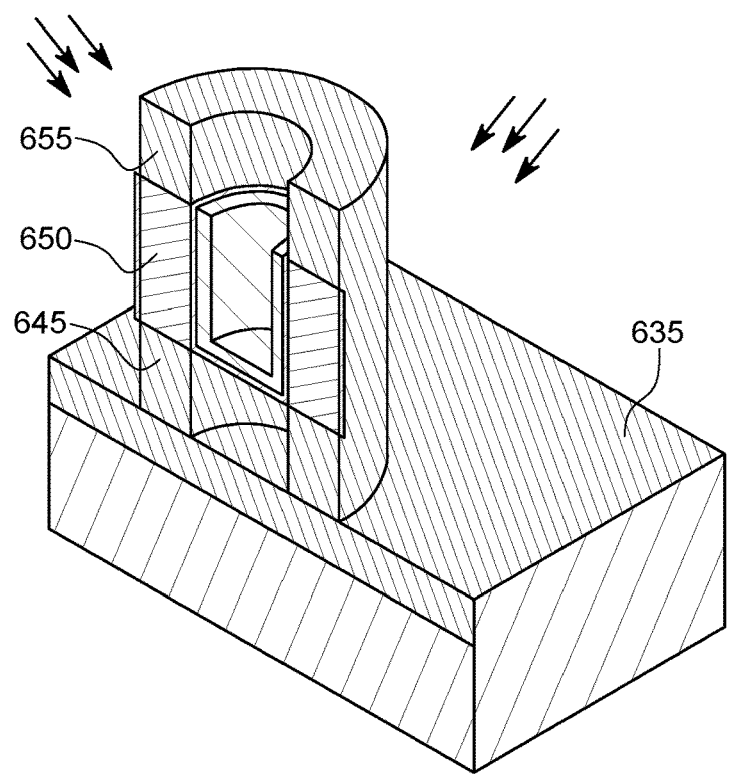
Figure 6H:
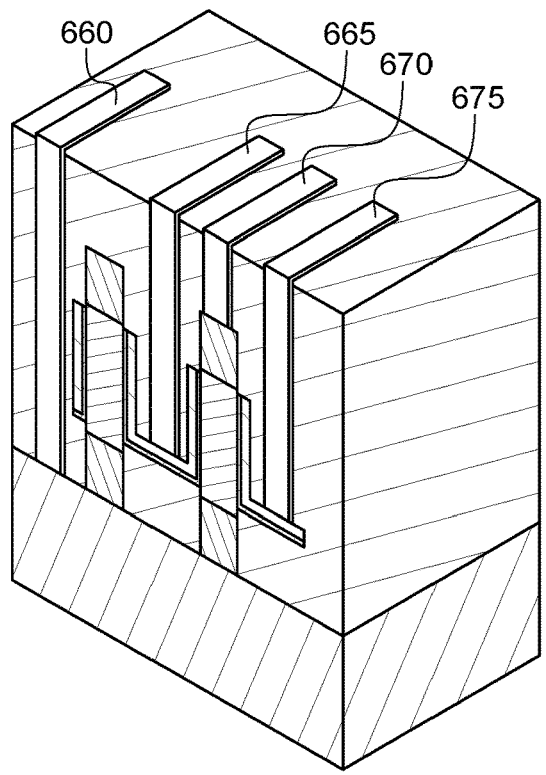

The oxide layers 615 and 630 are removed (step 540), the nanotube structure 610 is then masked (step 545), and the source 645, channel 650, and drain 655 are formed (step 550). This is illustrated in FIG. 6G. The formation of the source 645, channel 650, and drain 655 can be performed by, for example, implantation. As an alternative to forming the source 645, gate 650, and drain 655 at this stage in the processing, the source 645, gate 650, and drain 655 can be formed after the nanotube structure 610 is initially formed in step 505. Finally, as illustrated in FIG. 6H, the source contact 660, inner gate contact 665, drain contact 670 and outer gate contact 675 are formed and an oxide protective layer 680 is formed (step 555).

The disclosed embodiments provide methods and electronic structures (e.g., sensors and sensor systems) that are very space-efficient and provide a large surface for sensing, thus increasing sensing response times, which are particularly appropriate for IoT devices. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A sensor comprising:
a substrate;
a nanotube structure formed on top of the substrate;
a body formed on top of the substrate and surrounding the nanotube structure;
a source contact electrically coupled to a top portion of the nanotube structure;
a drain contact arranged on top of the substrate and electrically coupled with a bottom portion of the nanotube structure; and
a gate contact arranged on top of the nanotube structure, wherein the gate contact is electrically isolated from the top portion of the nanotube structure and electrically coupled with a middle portion of the nanotube structure,
wherein the top portion of the nanotube structure is exposed to an environment surrounding the sensor, and
wherein the top of the nanotube structure has a surface area exposed to the environment and at least 85% of surface area is not obscured.

2. The sensor of claim 1, wherein the top of the nanotube structure is covered only by the gate contact and a portion of the source contact.

3. The sensor of claim 1, wherein the nanotube structure comprises:
a first doped layer as the bottom portion;
a second doped layer as the middle portion, wherein the second doped layer is formed on the first doped layer;
a third doped layer as a top portion that includes the top of the nanotube structure, wherein the third doped layer is arranged on top of the second doped layer.

4. The sensor of claim 3, wherein the third doped layer comprises:
a passage from the top of the nanotube structure to the second doped layer, wherein a portion of the gate contact is arranged in the passage and is electrically coupled to the second doped layer.

5. The sensor of claim 3, wherein the first and third doped layers comprise silicon oxide and the second doped layer comprises titanium nitride.

6. The sensor of claim 1, further comprising:
an insulator arranged on top of the substrate and on an outer periphery of the body, wherein a portion of the source contact is on top of the insulator.

7. The sensor of claim 1, wherein the body comprises:
a gate dielectric surrounding the nanotube structure; and
silicon surrounding the gate dielectric.

8. The sensor of claim 7, wherein the gate dielectric comprises aluminum oxide and the silicon comprises polysilicon.

9. The sensor of claim 7, wherein the gate dielectric includes an enzyme.

10. A method for forming a sensor, the method comprising:
forming a nanotube structure on top of a substrate, the nanotube structure including a top layer, a middle layer, and a bottom layer that are distinct from each other;
forming a passage throughout the top layer to expose the middle layer;
forming a drain contact on top of the substrate and electrically coupled with the bottom layer of the nanotube structure;
forming a body on top of the substrate and surrounding the nanotube structure;
forming a gate contact in the passage of the nanotube structure so that the gate contact is electrically isolated from the top layer of the nanotube structure and is electrically coupled with the middle layer of the nanotube structure;
forming a source contact electrically coupled to the top layer of the nanotube structure, wherein the top layer of the nanotube structure is partially and directly exposed to an environment surrounding the sensor.

11. The method of claim 10, wherein the formation of the nanotube structure comprises:
forming a first doped layer on the substrate as the bottom layer;
forming a second doped layer as the middle layer and on top of the first doped layer;
forming a third doped layer as the top layer that includes the top of the nanotube structure, wherein the third doped layer is formed on top of the second doped layer.

12. The method of claim 10, further comprising:
forming an insulator on top of the substrate and on a periphery of the body, wherein a portion of the source contact is arranged on top of the insulator.

13. The method of claim 10, wherein the formation of the body comprises:
forming a gate dielectric surrounding the nanotube structure; and
forming silicon surrounding the gate dielectric.

14. A sensor system comprising:
a processor; and
a sensor coupled to the processor, wherein the sensor comprises,
a substrate;
a nanotube structure formed on top of the substrate, the nanotube structure including a top layer, a middle layer, and a bottom layer that are distinct from each other;
a body formed on top of the substrate and surrounding the nanotube structure;
a source contact electrically coupled to the top layer of the nanotube structure;
a drain contact arranged on top of the substrate and electrically coupled with the bottom layer of the nanotube structure; and
a gate contact arranged in a passage extending throughout the top layer, up to a top portion of the middle layer, wherein the gate contact is electrically isolated from the top layer of the nanotube structure and is electrically coupled with the middle layer of the nanotube structure,
wherein the top layer of the nanotube structure is partially and directly exposed to an environment surrounding the sensor.

15. The sensor system of claim 14, wherein the top of the nanotube structure is covered only by the gate contact and a portion of the source contact.

16. The sensor system of claim 15, wherein the top of the nanotube structure has a surface area exposed to the environment and at least 85% of surface area is not obscured.

17. The sensor system of claim 14, wherein the nanotube structure comprises:

a first doped layer as the bottom layer;
a second doped layer as the middle layer, wherein the second doped layer is formed on the first doped layer;
a third doped layer as the top layer that includes the top of the nanotube structure, wherein the third doped layer is arranged on top of the second doped layer.

18. The sensor system of claim 17, wherein the third doped layer comprises:
the passage from the top of the nanotube structure to the second doped layer, wherein a portion of the gate contact is arranged in the passage and is electrically coupled to the second doped layer.

* * * * *